United States Patent
Mooney et al.

(10) Patent No.: US 7,062,169 B2
(45) Date of Patent: Jun. 13, 2006

(54) SYSTEMS AND METHODS FOR COMPENSATING FOR SIGNAL TRANSIENTS

(75) Inventors: Greg Mooney, Forest Hill, MD (US); Guangning Yang, Clarksville, MD (US)

(73) Assignee: Dorsal Networks, Inc., Columbia, MD (US)

( * ) Notice: Subject to any disclaimer, the term of this patent is extended or adjusted under 35 U.S.C. 154(b) by 840 days.

(21) Appl. No.: 10/124,397

(22) Filed: Apr. 18, 2002

(65) Prior Publication Data

US 2003/0198474 A1  Oct. 23, 2003

(51) Int. Cl.
  *H04B 10/08*  (2006.01)
  *H04B 10/00*  (2006.01)
  *H04B 10/02*  (2006.01)
  *H04B 10/04*  (2006.01)
  *H04J 14/02*  (2006.01)

(52) U.S. Cl. .......................... 398/38; 398/94; 398/104; 398/158; 398/177; 398/192

(58) Field of Classification Search ................. 398/38, 398/94, 104, 158, 177, 192
  See application file for complete search history.

(56) References Cited

U.S. PATENT DOCUMENTS

| | | | |
|---|---|---|---|
| 5,636,048 A | 6/1997 | Kogure et al. | 359/189 |
| 5,706,118 A | 1/1998 | Takano | 359/189 |
| 6,163,399 A | 12/2000 | Berg | 359/341 |
| 6,166,850 A * | 12/2000 | Roberts et al. | 359/341.2 |
| 6,342,959 B1 | 1/2002 | Haxell et al. | 359/124 |
| 6,356,375 B1 * | 3/2002 | Holcombe | 398/209 |

* cited by examiner

*Primary Examiner*—M. R. Sedighian

(57) ABSTRACT

A system compensates for the presence of power transients. The system receives a data signal and detects the occurrence of a power transient. The system generates a threshold signal based on the detected power transient and determines a value of the data signal based on the threshold signal.

15 Claims, 12 Drawing Sheets

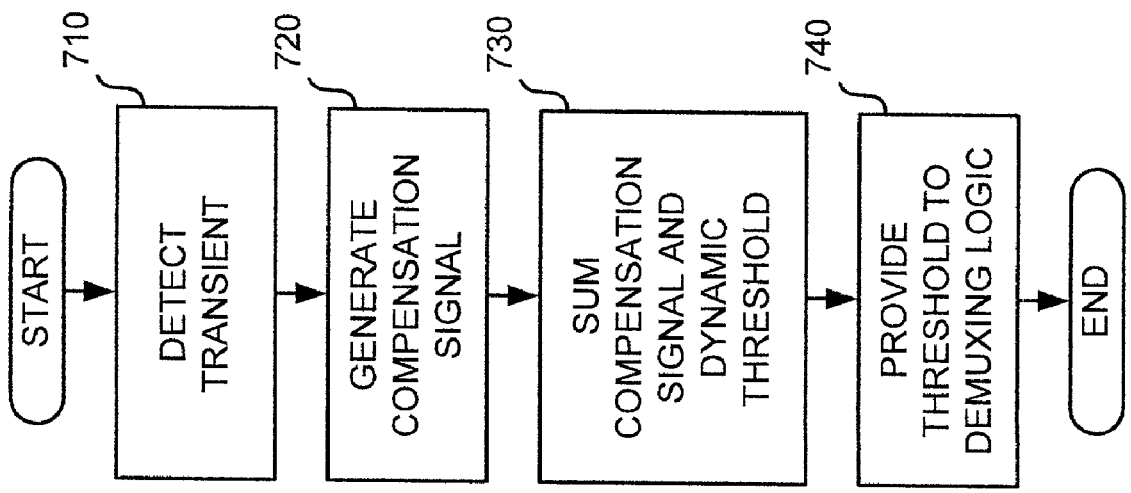

SYSTEMS AND METHODS FOR COMPENSATING FOR SIGNAL TRANSIENTS

BACKGROUND OF THE INVENTION

1. Field of the Invention

The present invention relates generally to optical systems and, more particularly, to systems and methods for compensating for the effects of transients in an optical system.

2. Description of Related Art

In the field of fiber optic communications, systems transmit wavelength-division multiplexed (WDM) optical signals along optical fibers to increase the capacity of an optical communications link. A WDM signal includes multiple distinct wavelengths of light. Each of the wavelengths carries a respective optical information signal, known as an information "channel." The number of wavelengths (i.e., information channels) in a WDM signal is a system parameter and usually ranges from 2 to 128 or more (in the case of "dense" WDM (DWDM)).

As the WDM signal travels through an optical network, it gradually fades and is, therefore, amplified at various points along its route. Because of the large number of wavelengths that can be carried by a single WDM signal, and also due to the high data rates of the individual information channels, amplification is typically performed by optical means.

Optical amplifiers can perform signal amplification using a doped length of optical fiber. Suitable candidate doping components for achieving optical amplification are rare earth doped-fiber amplifiers, such as erbium doped-fiber amplifiers (EDFAs). In an amplifier, it is possible to set the total output power level of the amplifier to a desired value, thereby establishing a relationship between the power of a WDM input signal entering the amplifier and the power of a WDM output signal exiting the amplifier. This also establishes a gain relationship for the information channels passing through the amplifier.

Ideally, the gain applied by the amplifier to the information channels remains at a constant value. Transients caused by the instantaneous addition or removal of one or more individual optical information channels affects the power of the WDM input signal. Although the amplifier instantaneously reacts to such a change in input power by providing a corresponding change in output power, thereby maintaining a constant gain for a brief amount of time, a natural recovery process is initiated soon thereafter by the amplifier, whereby the specified total output power eventually becomes redistributed among the new number of wavelengths (or information channels).

In the case of a channel being dropped, the effect of this transient will be an eventual increase in gain for the remaining information channels as the amplifier settles into steady-state operation. Conversely, in the case of an optical information channel being added, the specified total output power is shared (possibly unevenly) among the now larger number of wavelengths, leading to a decrease in gain for the information channels as the amplifier reaches a steady state.

The characteristics of these transients may depend upon the physics of the amplifiers, the number of amplifiers present, and possibly the distance between the amplifiers. Improper handling of the transients may result in degradation in the quality of the information channels reaching downstream components of the fiber optic network.

As a result, there exists a need for systems and methods for compensating for transients in an optical system.

SUMMARY OF THE INVENTION

Systems and methods consistent with the present invention address this and other needs by providing transient compensation logic that compensates for the presence of transients associated with optical signals.

In accordance with the principles of this invention as embodied and broadly described herein, a system compensates for the presence of power transients. The system receives a data signal and detects the occurrence of a power transient. The system generates a threshold signal based on the detected power transient and determines a value of the data signal based on the threshold signal.

In another implementation consistent with the present invention, a terrestrial terminal connects to an optical underwater network. The terrestrial terminal includes a transmitter and a receiver. The transmitter is configured to convert terrestrial signals into an optical format for transmission to the optical underwater network. The receiver is configured to receive an undersea optical signal from the optical underwater network. The receiver includes a filter, an optical-to-electrical converter, signal conditioning logic, and demultiplexing logic. The filter is configured to filter the optical signal. The optical-to-electrical converter is configured to convert the optical signal to an electrical signal. The signal conditioning logic is configured to process a data signal from the electrical signal, detect occurrence of a power transient, and generate a threshold signal based on the detected power transient. The demultiplexing logic is configured to receive the data signal and the threshold signal from the signal conditioning logic and determine characteristics of the data signal based on the threshold signal.

BRIEF DESCRIPTION OF THE DRAWINGS

The accompanying drawings, which are incorporated in and constitute a part of this specification, illustrate an embodiment of the invention and, together with the description, explain the invention. In the drawings.

FIG. 7 is a flowchart of exemplary processing by the signal conditioning logic illustrated in FIG. 4 according to an implementation consistent with the present invention;

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and equivalents.

Systems and methods consistent with the present invention provide transient compensation logic that compensates for the presence of transients associated with optical signals.

Exemplary System Configuration

Figure 1:
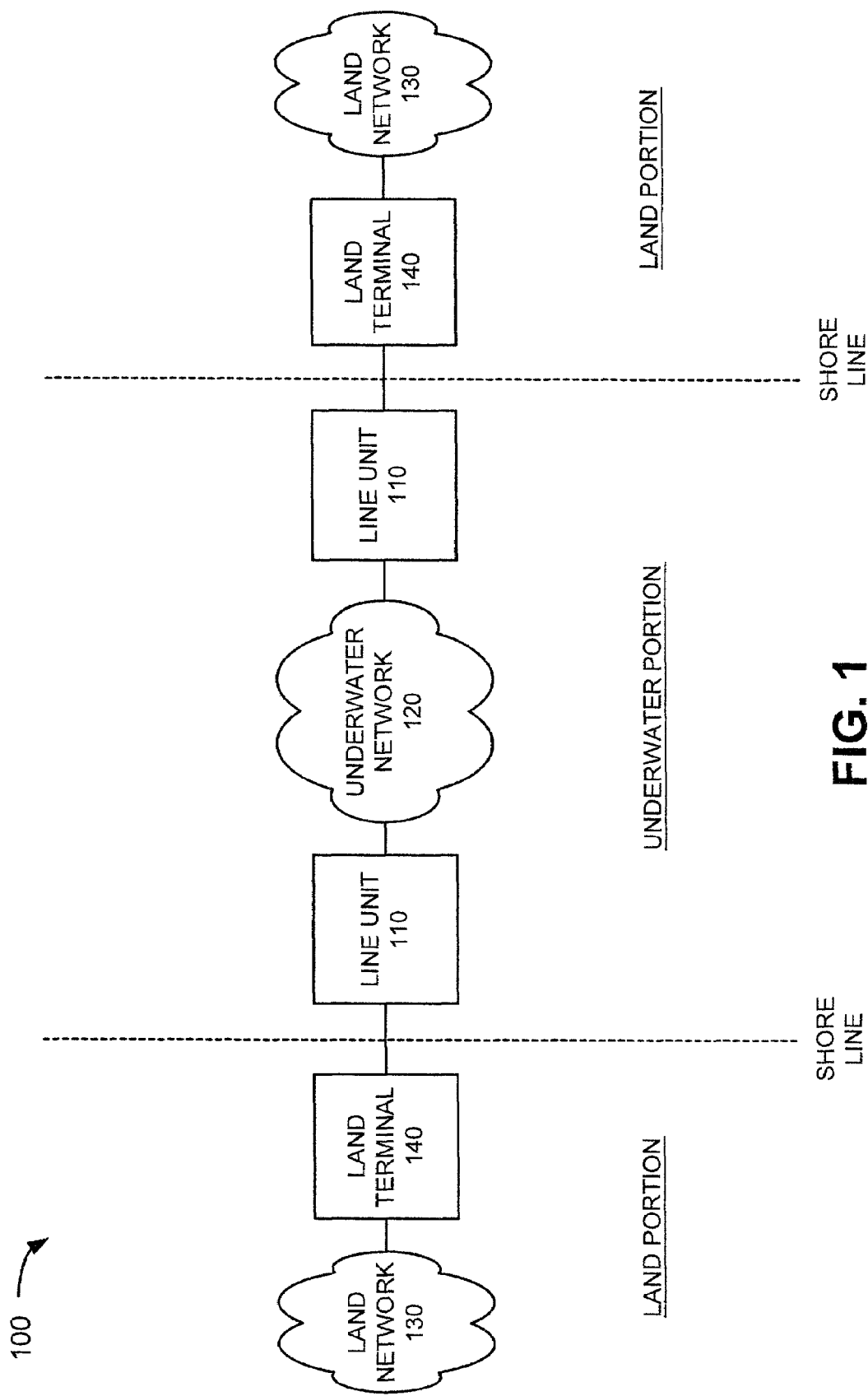
FIG. 1 is a diagram of an exemplary system in which systems and methods consistent with the present invention may be implemented.

FIG. 1 is a diagram of an exemplary system 100 in which systems and methods consistent with the present invention may be implemented. As illustrated, system 100 includes two land communication portions that are interconnected via an underwater communication portion. The underwater portion may include line units 110 and an underwater network 120. The land portions may include land networks 130 and land terminals 140. Two land networks 130, land terminals 140, and line units 110, and a single underwater network 120 are illustrated for simplicity. It will be appreciated that a typical system may include more or fewer devices and networks than are illustrated in FIG. 1.

Underwater network 120 may include groups of line units and/or other devices capable of routing and amplifying optical signals in an underwater environment. Line units 110 are sometimes referred to as "repeaters" and may include devices capable of receiving, processing, and transmitting optical signals to land terminals 140 or other line units via underwater network 120. For example, line units 110 may include pump modules that provide pump light into optical fibers to amplify data signals traveling in the optical fibers using, for example, a Raman amplification scheme.

Land network 130 may include one or more types of networks, such as the Internet, an intranet, a wide area network (WAN), a local area network (LAN), or another type of network. Land terminal 140 may include a device that converts signals received from land network 130 into optical signals for transmission to line unit 110, and vice versa. Land terminal 140 may connect to land network 130 via wired, wireless, or optical connections. In an implementation consistent with the present invention, land terminal 140 connects to line unit 110 via optical connections.

Figure 2:
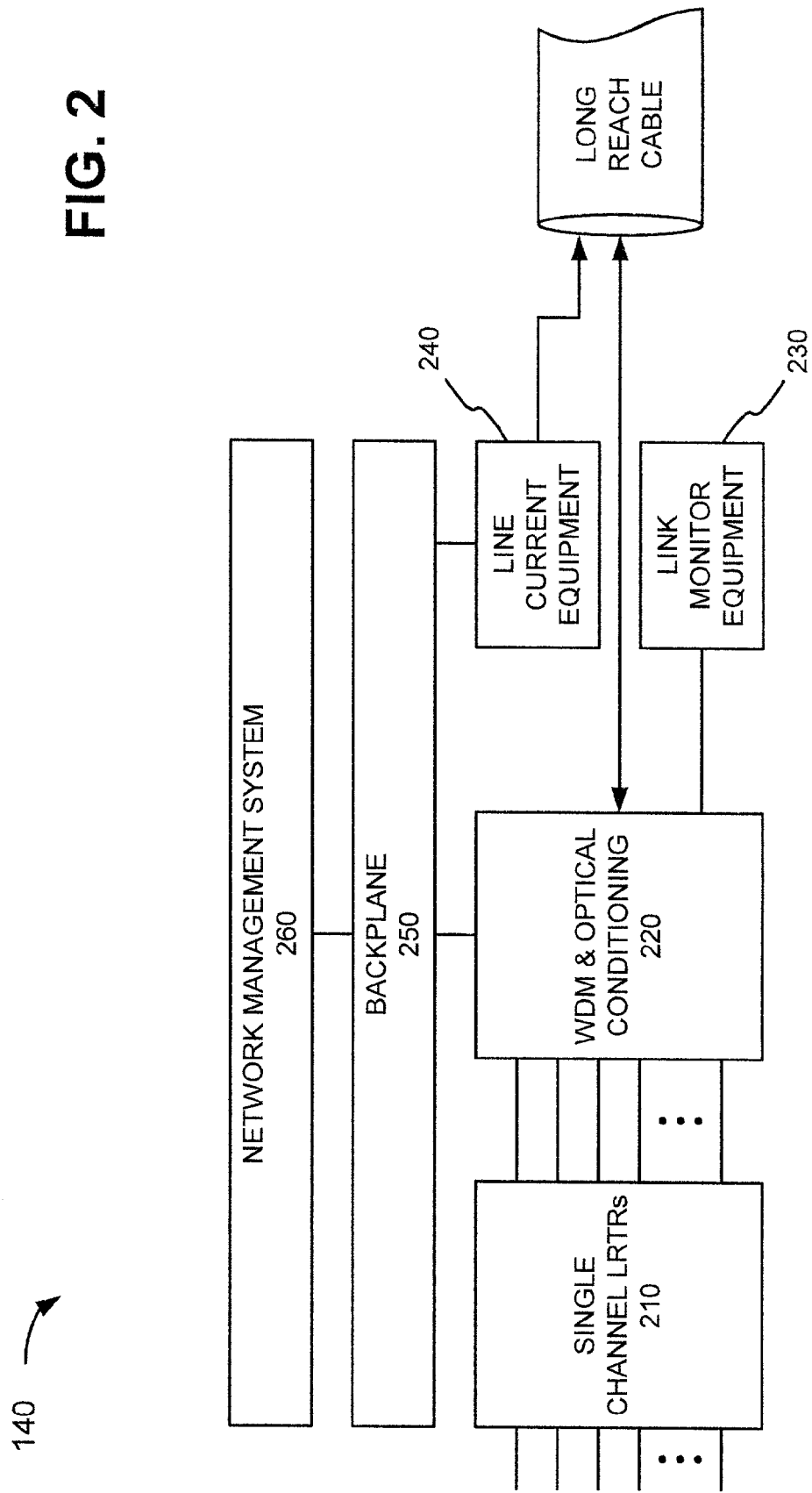
FIG. 2 is an exemplary diagram of a land terminal of FIG. 1 according to an implementation consistent with the principles of the invention.

FIG. 2 is a block diagram of land terminal 140 according to an implementation consistent with the principles of the invention. In FIG. 2, land terminal 140 may include single channel long reach transmitters/receivers (LRTRs) 210, wavelength division multiplexers (WDMs) and optical conditioning logic 220, link monitor equipment 230, line current equipment 240, a backplane 250, and a network management system 260. Backplane 250 connects network management system 260 to WDM and optical conditioning logic 220 and line current equipment 240.

Each of LRTRs 210 may convert terrestrial signals into an optical format for long haul transmission, convert the undersea optical signal back into its original terrestrial format and provide forward error correction. WDM and optical conditioning logic 220 may include logic that multiplexes and amplifies the optical signals in preparation for their transmission over a long reach cable and, in the opposite direction, demultiplexes optical signals received from the long reach cable.

Link monitor equipment 230 may include logic that monitors the undersea optical signals and undersea equipment for proper operation. Line current equipment 240 may provide power to line unit 110. Network management system 260 may control the operation of the other components in land terminal 140, as well as send commands to line units, such as line unit 110, via link monitor equipment 230.

Exemplary Long Reach Transmitter/Receiver

Figure 3:
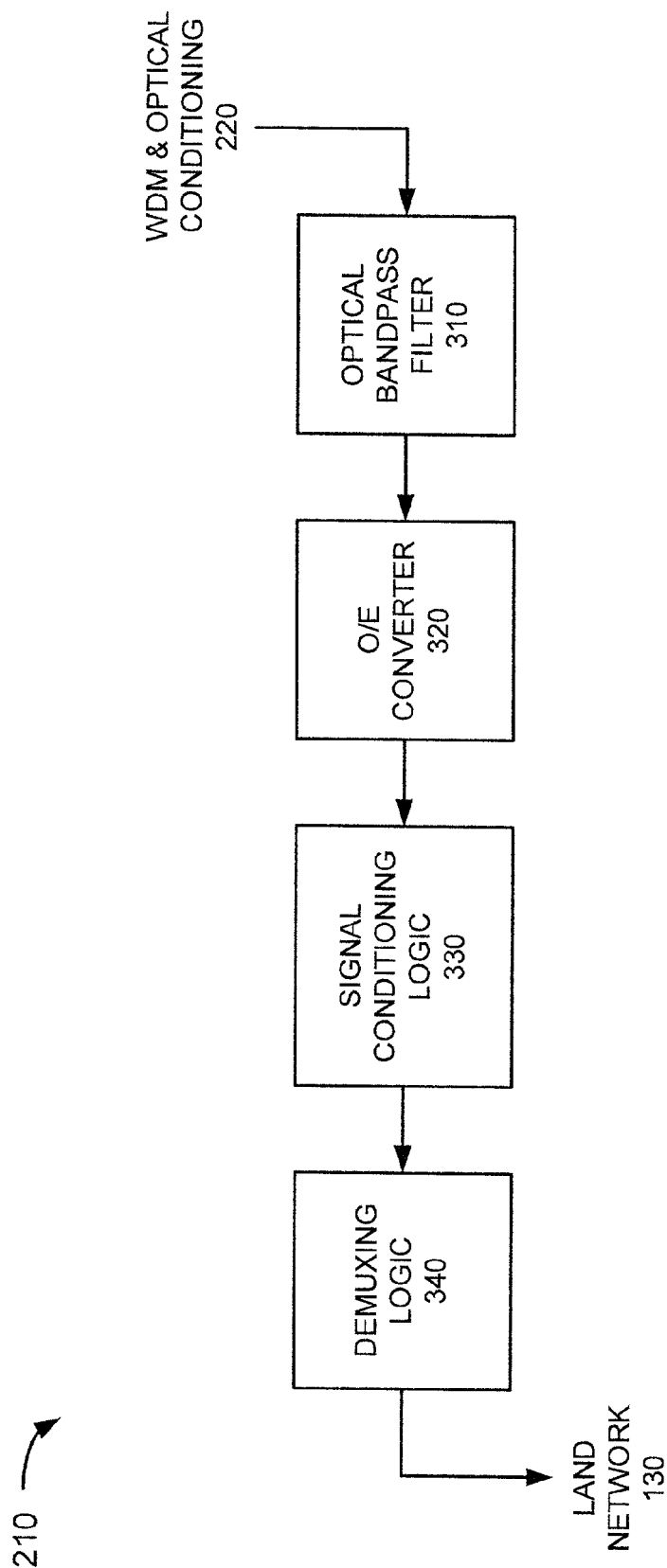
FIG. 3 is an exemplary diagram of a portion of a long reach transmitter/receiver (LRTR) of FIG. 2 according to an implementation consistent with the principles of the invention.

FIG. 3 is an exemplary diagram of a portion of LRTR 210 for converting optical signals to electrical signals according to an implementation consistent with the principles of the invention. LRTR 210 may include optical bandpass filter 310, optical-to-electrical (O/E) converter 320, signal conditioning logic 330, and demultiplexing (demuxing) logic 340. Bandpass filter 310 may receive optical signals from, for example, line unit 110 and filter the signals to allow signals of certain wavelengths to pass.

O/E converter 320 may include a photodiode that converts the optical signals from bandpass filter 310 to electrical signals. Signal conditioning logic 330 may include, for example, an electrical amplifier and/or an electrical filter to process (or condition) the electrical signals from O/E converter 320. Demultiplexing logic 340 may include a conventional demultiplexer and support circuitry that separates the electrical signals for transmission over a network, such as land network 130. Demultiplexing logic 340 may also include clock and data recovery logic to facilitate the extraction of clock and data signals from a signal stream.

Figure 4:
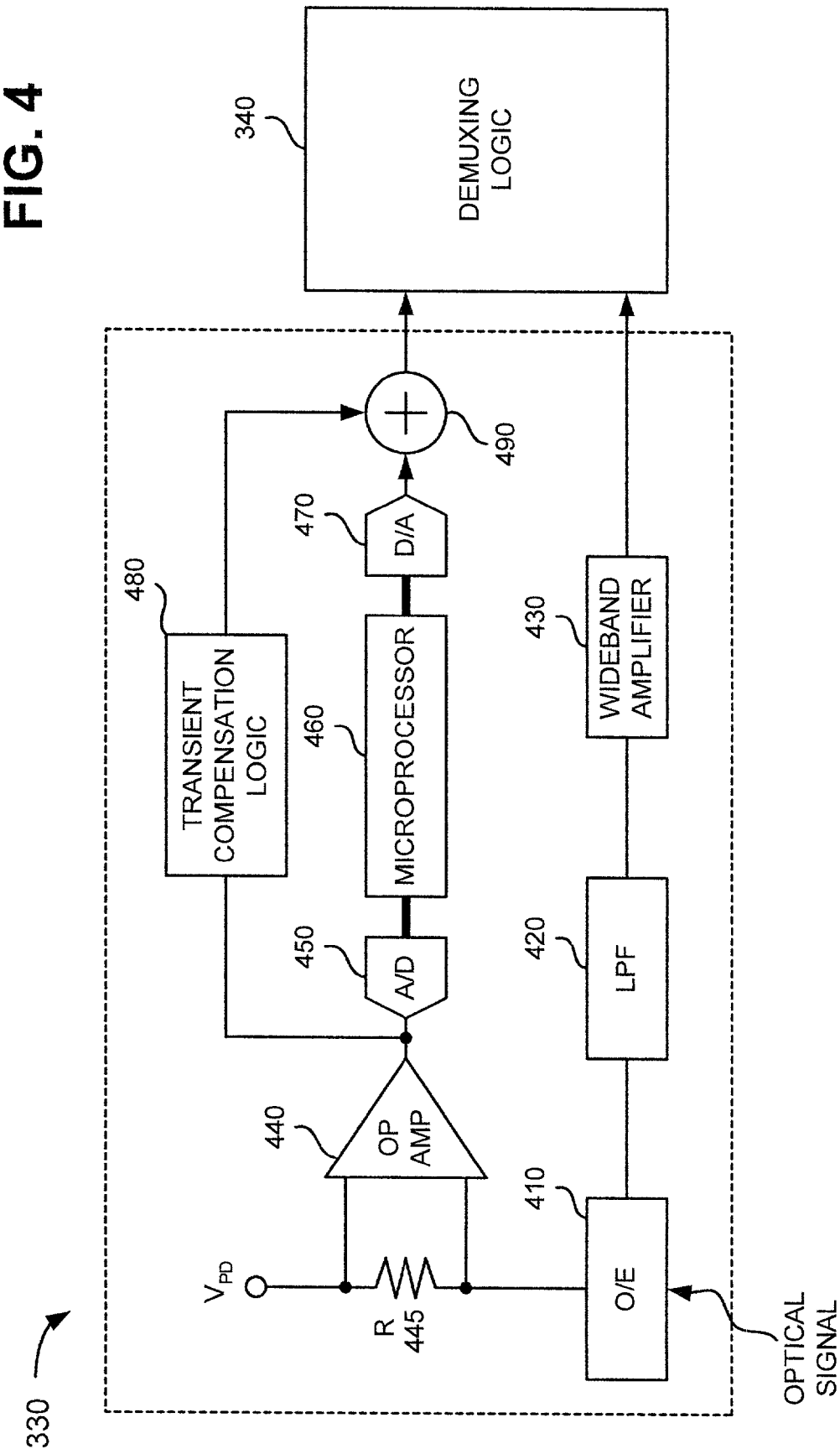
FIG. 4 is an exemplary diagram of a portion of the signal conditioning logic of FIG. 3 according to an implementation consistent with the principles of the invention.

FIG. 4 is an exemplary diagram of a portion of signal conditioning logic 330 according to an implementation consistent with the principles of the invention. In one implementation, the portion of signal conditioning logic 330 shown in FIG. 4 is a receiver portion. Signal conditioning logic 330 may include O/E converter 410, low pass filter (LPF) 420, wideband amplifier 430, operational amplifier (op amp) 440, analog-to-digital (A/D) converter 450, microprocessor 460, digital-to-analog (D/A) converter 470, transient compensation circuit 480, and summer 490.

O/E converter 410 may include a photodiode or the like that converts a received optical signal into an electrical signal. In one implementation consistent with the principles of the invention, O/E converter 320 (FIG. 3) includes, or is the same as, O/E converter 410. Low pass filter 420 may filter the electrical signals output from O/E converter 410 to allow signals under a certain frequency to pass. Wideband amplifier 430 may amplify the signals from low pass filter 420 and provide the amplified signals to demultiplexing logic 340. In one implementation consistent with the principles of the invention, the signals output by wideband amplifier 430 include data signals with embedded clock signals.

O/E converter 410, in operation, draws power from a power voltage $V_{PD}$. Amplifier 440 may monitor the amount of current that is drawn from the power voltage $V_{PD}$, which is proportional to the amount of optical power that is incident on O/E converter 410. During normal operation, this power may remain relatively constant. When a transient occurs, however, the power may rapidly increase or decrease for a period of time. Amplifier 440 may detect this power fluctuation by monitoring the voltage across a resistor (R) 445. In an implementation consistent with the present invention, resistor 445 may have a value of 500 Ω. A/D converter 450 may convert the analog signal from amplifier 440 to a digital signal for use by microprocessor 460.

Microprocessor 460 may be physically located within signal conditioning logic 330 or elsewhere. Microprocessor 460 may generate a dynamic (steady-state) threshold value, based on the digital signal from A/D converter 450, that compensates for long term changes in the signal power. Microprocessor 460 monitors long term changes in the signal power and then adjusts the threshold value to compensate. Transients result in short term changes in the signal power, which may not be adequately compensated for by microprocessor 460. D/A converter 470 may convert the digital signal (e.g., threshold value) from microprocessor 460 back into an analog signal for transmission to summer 490.

Figure 5:
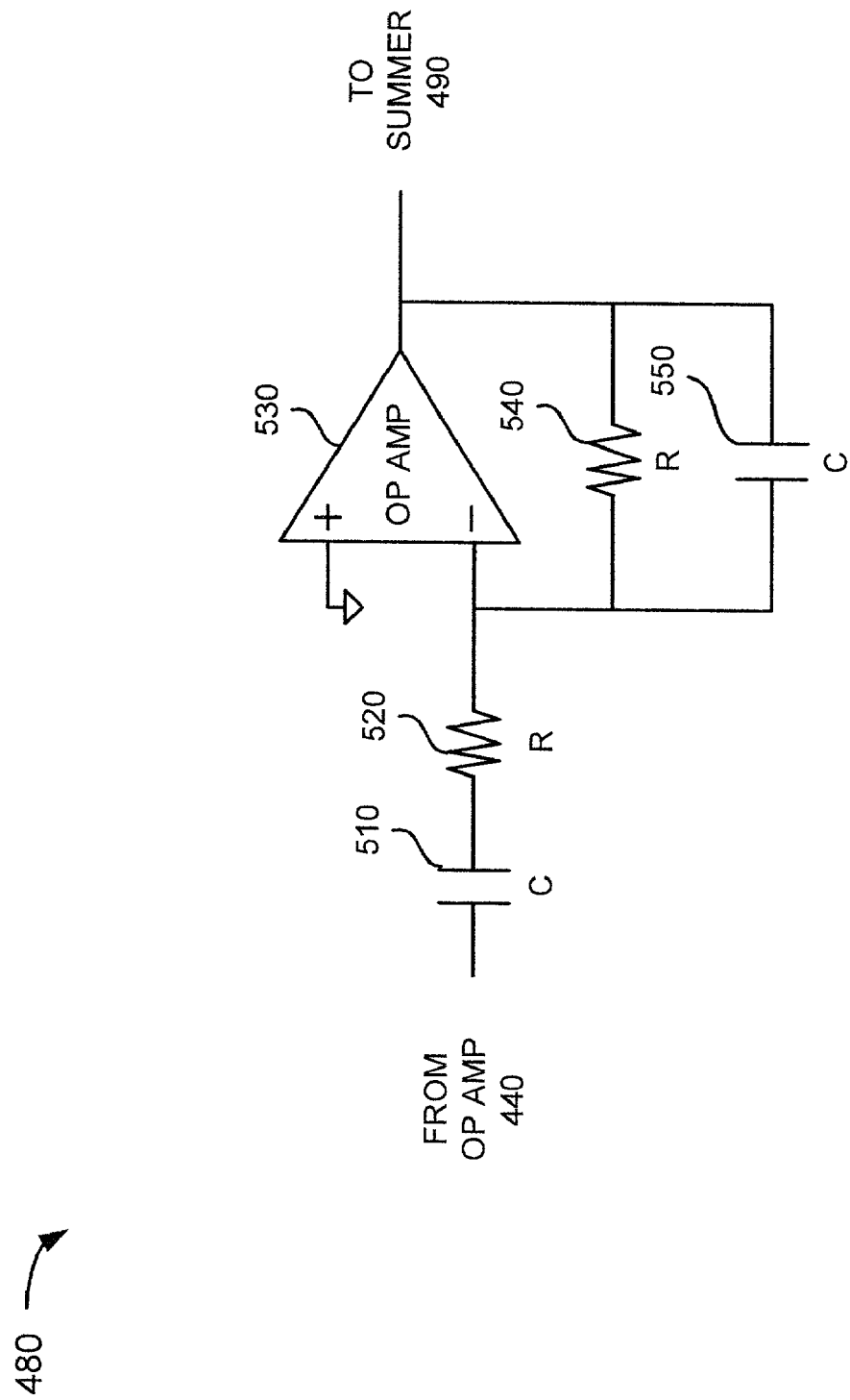
FIG. 5 is an exemplary diagram of the transient compensation logic of FIG. 4 according to an implementation consistent with the principles of the invention.

Transient compensation logic 480 compensates for signal transients for which microprocessor 460 does not compensate. FIG. 5 is an exemplary diagram of transient compensation logic 480 according to an implementation consistent with the principles of the invention. Transient compensation logic 480 may include capacitor 510, resistor 520, operational amplifier (op amp) 530, resistor 540, and capacitor 550. Operational amplifier 530 may include a conventional operational amplifier that receives a signal from amplifier 440 (FIG. 4) and provides an output signal to summer 490.

Capacitor 510 may connect in series with resistor 520 to the inverting input of operational amplifier 530. In one implementation consistent with the principles of the invention, capacitor 510 may include a 3.2 nF capacitor and resistor 520 may include a 1 kΩ resistor. Resistor 540 and capacitor 550 may connect in parallel between the inverting input and the output of operational amplifier 530. In one implementation consistent with the principles of the invention, resistor 540 may include a 1 kΩ resistor and capacitor 550 may include a 16 pF capacitor.

These components of transient compensation logic 480 use the output of amplifier 440 to generate a compensation signal. If no transient exists, the compensation signal has a zero value.

Returning to FIG. 4, the compensation signal from transient compensation logic 480 is combined with the dynamic threshold value from microprocessor 460 by summer 490. Summer 490 may include conventional mechanisms to generate a threshold signal by combining the threshold value from microprocessor 460 and the compensation signal from transient compensation logic 480. When no transient is present, the output of transient compensation logic 480 is zero. When a transient exists, however, the compensation signal from transient compensation logic 480 is added to the dynamic threshold value from microprocessor 460 and provided to demultiplexing logic 340.

Demultiplexing logic 340 may use the threshold signal from summer 490 in analyzing the signal received from wideband amplifier 430. For example, in an implementation consistent with the present invention, demultiplexing logic 340 uses the threshold signal to determine the characteristics of the signal received from wideband amplifier 430. For example, demultiplexing logic 340 may determine whether the signal is a one or a zero.

Figure 6:
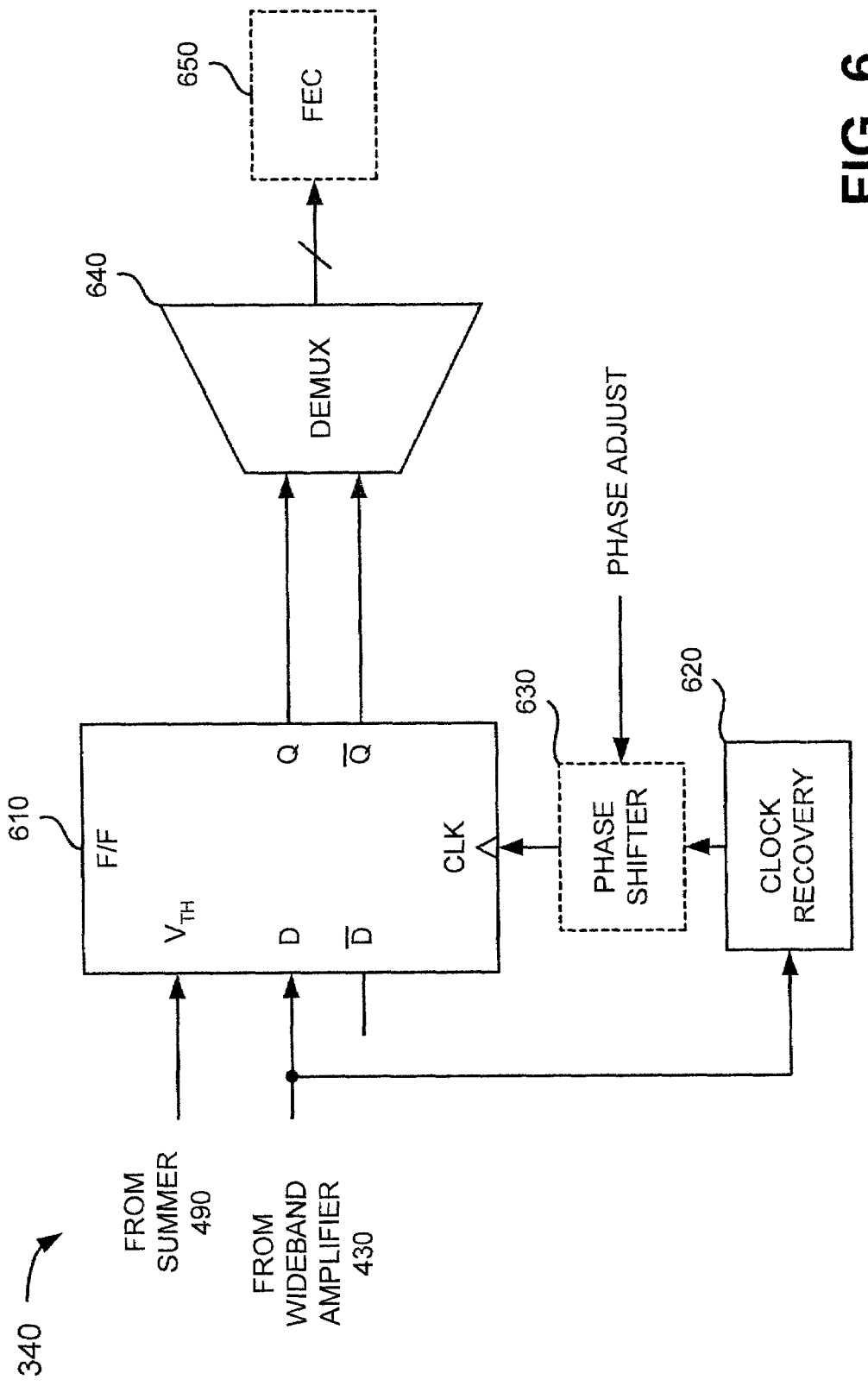
FIG. 6 is an exemplary diagram of the demultiplexing logic of FIG. 3 according to an implementation consistent with the principles of the invention.

FIG. 6 is an exemplary diagram of demultiplexing logic 340 according to an implementation consistent with the principles of the invention. Demultiplexing logic 340 may include flip/flop (F/F) 610, clock recovery logic 620, phase shifter 630, demultiplexer 640, and forward error correction (FEC) logic 650. Phase shifter 630 and forward error correction logic 650 have been illustrated using dotted lines. This means that these components may be eliminated or located somewhere other than in demultiplexing logic 340 in other implementations consistent with the principles of the invention.

Flip/flop 610 may include a D flip/flop with threshold ($V_{TH}$), D, $\overline{D}$, and clock (CLK) inputs and Q and $\overline{Q}$ outputs. The threshold input may receive the threshold signal from summer 490. The D input may receive the output from wideband amplifier 430. The clock input may receive the output of phase shifter 630 or clock recovery logic 620. The Q and $\overline{Q}$ outputs may provide the outputs of flip/flop 610 to demultiplexer 640. Flip/flop 610 may use the threshold input to determine the characteristics of the data received by the D input. For example, flip/flop 610 may use the threshold input to assist in determining whether the data received at the D input is a one or a zero.

Clock recovery logic 620 may extract a clock signal from the signal output from wideband amplifier 430. Clock recovery logic 620 may use conventional techniques to extract the clock signal. Phase shifter 630 may receive an input ("phase adjust") that permits the phase of the clock signal extracted by clock recovery logic 620 to be adjusted. Such a phase adjustment permits the point at which the data signal is sampled with respect to time to be varied.

Demultiplexer 640 may include a conventional demultiplexer that receives the Q and $\overline{Q}$ outputs from flip/flop 610 and separates the data signals for transmission on an output bus to FEC logic 650. FEC logic 650 may provide forward error correction on the data signals from demultiplexer 640. FEC logic 650 may use conventional techniques to perform the forward error correction.

System Processing

FIG. 7 is a flowchart of exemplary processing by signal conditioning logic 330 according to an implementation consistent with the present invention. Processing may begin with a transient occurring due to a relatively rapid change in power. For example, a transient may occur due to instantaneous signal power changes resulting from the addition or removal of one or more individual optical channels. The characteristics (e.g., frequency and duration) of the transient may vary based on factors, such as the physics of the signal amplifiers and the number and distance between the amplifiers.

Figure 8A:
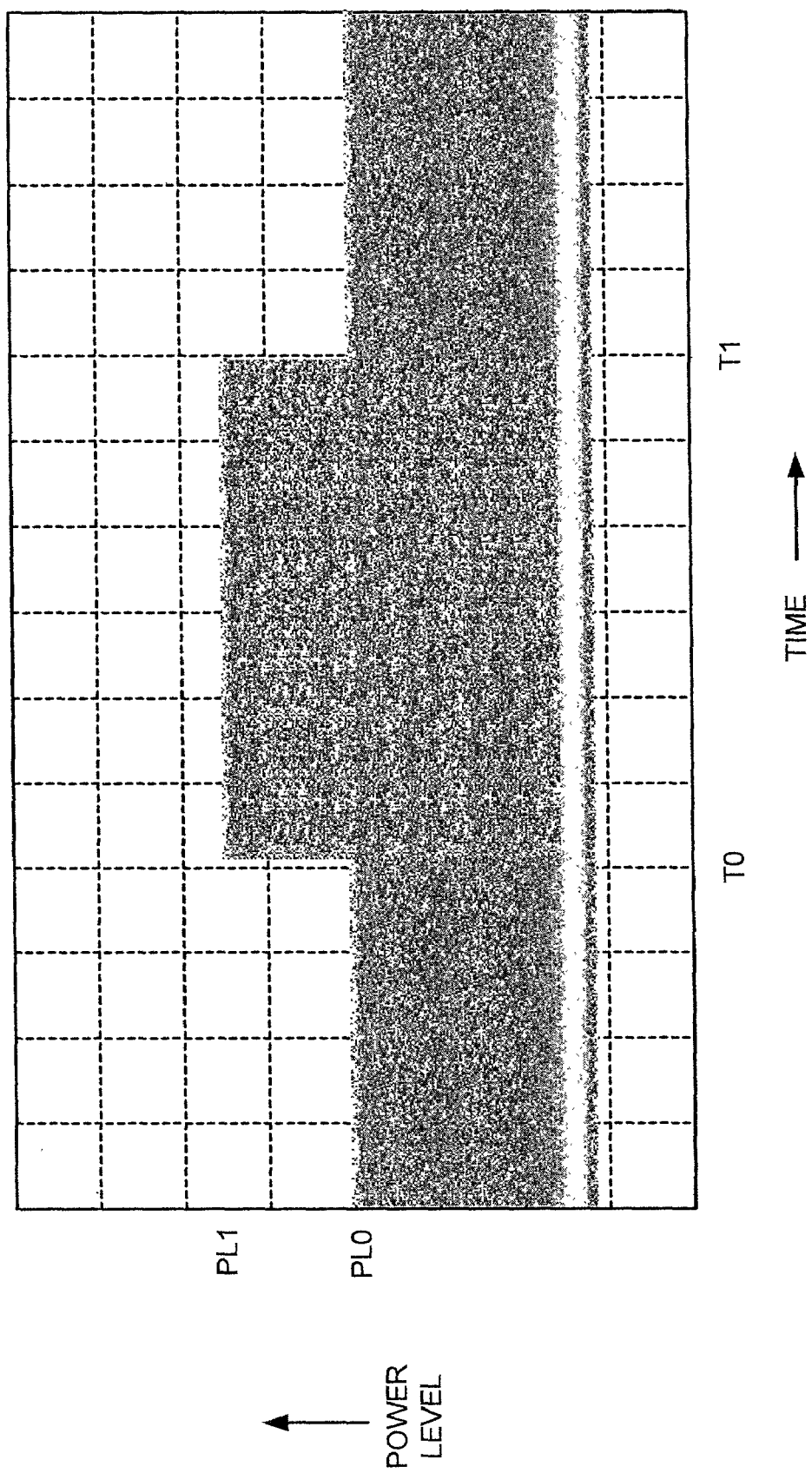
FIGS. 8A and 8B are graphs depicting the effects of transients on power level in the optical domain.
Figure 8B:
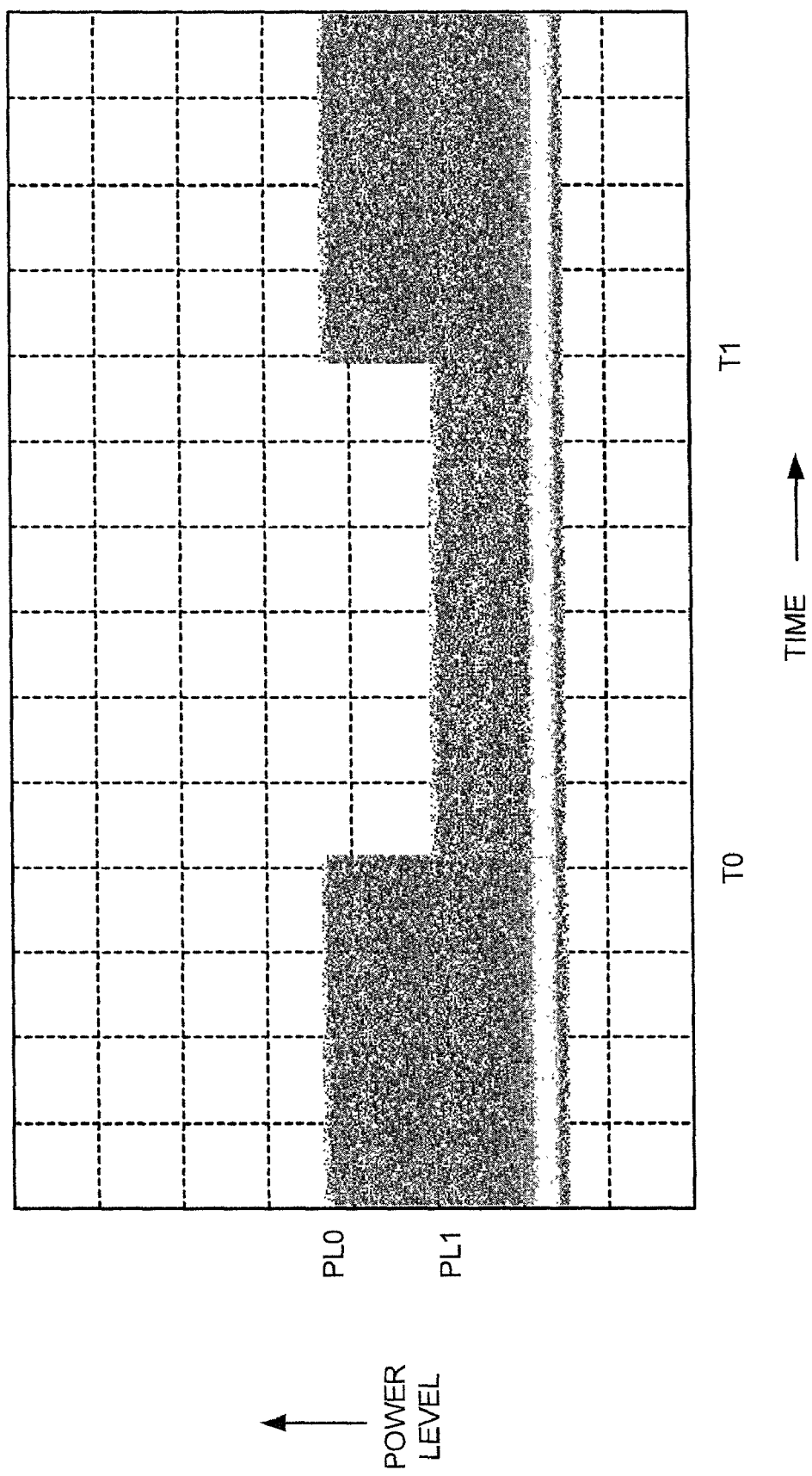

FIGS. 8A and 8B are graphs depicting the effects of transients on power levels in the optical domain. Such power levels may occur at the input of O/E converter 410. FIG. 8A illustrates the effects of a transient resulting from a relatively rapid increase in power. As shown in FIG. 8A, the power level remains relatively constant (at PL0) until the occurrence of the transient (at T0). At this point, the power level increases (to (PL1) for the duration of the transient (until T1) and then returns to its initial power level (at (PL0). FIG. 8B illustrates the effects of a transient resulting from a relatively rapid decrease in power. As shown in FIG. 8B, the power level remains relatively constant (at (PL0)) until the occurrence of the transient (at T0). At this point, the power level decreases (to (PL1)) for the duration of the transient (until T1) and then returns to its initial power level (at (PL0)).

Returning to FIG. 7, amplifier 440 detects fluctuations in the optical power incident upon O/E converter 410, due, for example, to the occurrence of a power transient, by monitoring changes in the voltage across resistor 445 (act 710). A/D converter 450 converts the output from amplifier 440 to a digital signal and provides it to microprocessor 460. From this signal, microprocessor 460 generates and/or adjusts a dynamic threshold value. Microprocessor 460 provides the threshold value to D/A converter 470, which converts it to an analog signal and provides it to summer 490.

Transient compensation logic 480 also receives the output from amplifier 440 and generates a compensation signal that compensates for the presence of the power transient (act 720). When no transient is present, the compensation signal has a value of zero. Transient compensation logic 480 provides the compensation signal to summer 490, which combines it with the dynamic threshold value from microprocessor 460 to generate a threshold signal (act 730). Summer 490 provides the threshold signal to the threshold input ($V_{TH}$) of flip/flop 610 (FIG. 6) of demultiplexing logic 340 (act 740).

Meanwhile, O/E converter 410 converts the received optical signal to an electrical signal. Low pass filter 420 filters the electrical signal. Wideband amplifier 430 amplifies the filtered signal and provides its output to demultiplexing logic 340. As described above, the output of wideband amplifier 430 is a data signal with an embedded clock signal. Wideband amplifier 430 provides the data signal to the D input of flip/flop 610 (FIG. 6) of demultiplexing logic 340.

Figure 9:
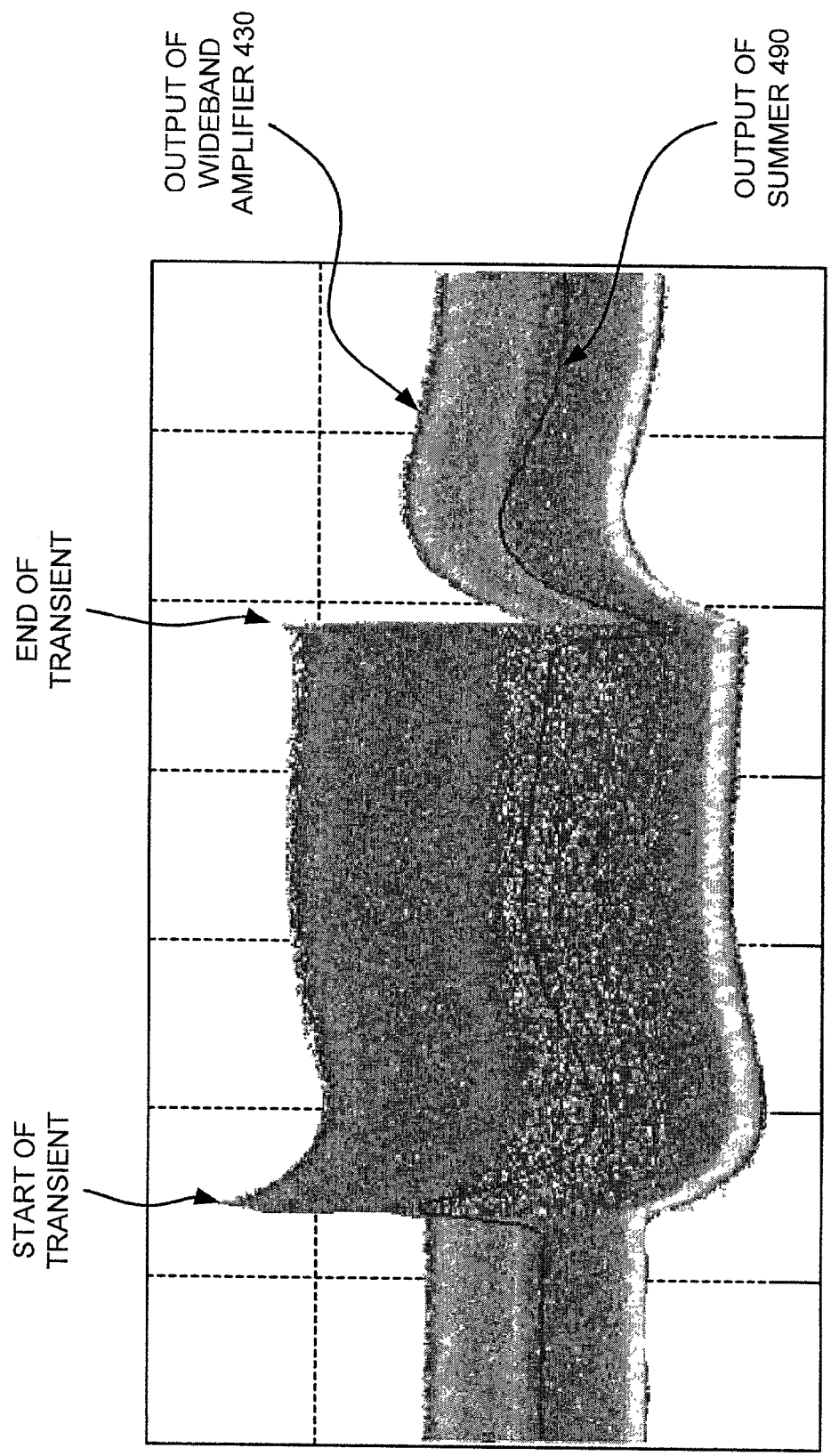
FIG. 9 is a graph of possible signals input to the demultiplexing logic.

FIG. 9 is a graph of possible signals input to demultiplexing logic 340. As shown in FIG. 9, the data signal from wideband amplifier 430 begins at a constant level and spikes upward when the transient occurs (assuming the transient involves an increase in power). Once the transient ends, the data signal spikes downward and returns to the constant level.

The threshold signal output from summer 490 is also shown in FIG. 9. The threshold signal tracks the changes in the data signal. In other words, the threshold signal begins at a constant level, spikes upward when the transient occurs, spikes downward at the end of the transient, and then returns to the constant level. The transient compensation logic 480 makes this tracking possible.

Exemplary Results

Figure 10A:
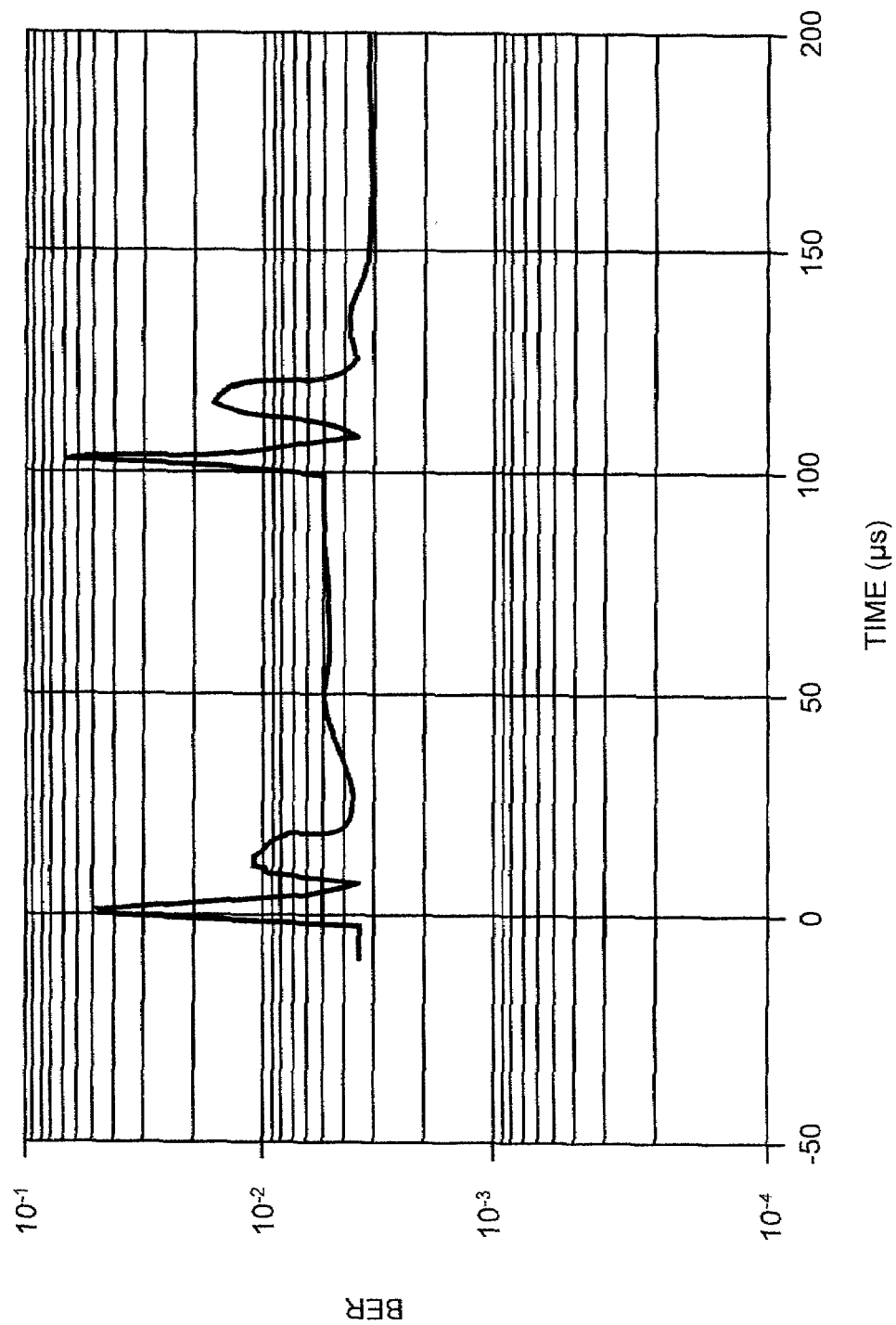
FIGS. 10A and 10B are graphs that illustrate how the bit error rate (BER) can be affected by transients.
Figure 10B:
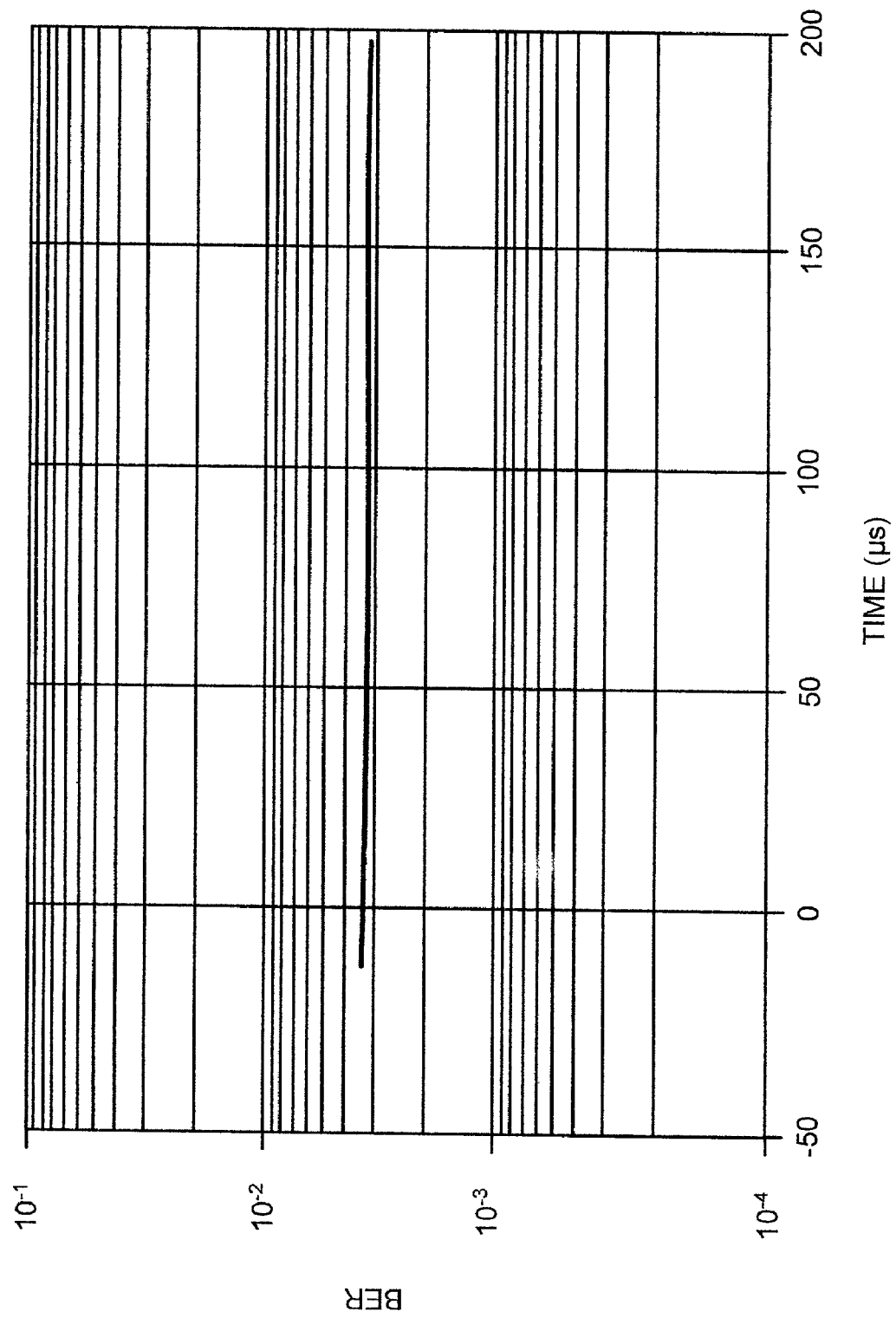

FIGS. 10A and 10B are graphs that illustrate how the bit error rate (BER) is affected by transients. Assume for purposes of this example, that the transient occurs at time 0 and ends at time 100. FIG. 10A illustrates the case where signal conditioning logic 330 includes no transient compensation logic 480. As shown in FIG. 10A, the bit error rate increases at the start and end of the transient. FIG. 10B illustrates the case where signal conditioning logic 330 includes transient compensation logic 480. As shown in FIG. 10B, the bit error rate remains relatively constant despite the occurrence of the transient.

Conclusion

Systems and methods, consistent with the present invention, compensate for the occurrence of power transients. The systems and methods alter a threshold value used by demultiplexing logic to track the increase or decrease in power caused by the transient.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, certain portions of the invention have been described as "logic" that performs one or more functions. This logic may include hardware, such as analog or digital circuitry or an application specific integrated circuit, software, or a combination of hardware and software.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A receiver for compensating for optical power transients, comprising:
   demultiplexing logic configured to:
      receive a data signal,
      receive a threshold signal, and
      determine characteristics of the data signal based on the threshold signal; and
   conditioning logic configured to:
      detect occurrence of a power transient, and
      generate the threshold signal based on the detected power transient, wherein when generating the threshold signal, the conditioning logic is configured to:
         generate a threshold value,
         generate a compensation signal based on the detected power transient, and
         generate the threshold signal based on the threshold value and the compensation signal.

2. The receiver of claim 1, wherein when generating the threshold signal based on the threshold value and the compensation signal, the conditioning logic is configured to:
   combine the threshold value and the compensation signal.

3. The receiver of claim 1, wherein the conditioning logic includes:
   a microprocessor configured to generate the threshold value, and
   transient compensation logic configured to generate the compensation signal.

4. The receiver of claim 3, wherein the transient compensation logic includes:
   an operational amplifier,
   first and second resistors connected to an input of the operational amplifier, and
   first and second capacitors connected to an input of the operational amplifier.

5. The receiver of claim 4, wherein the first resistor and the first capacitor connect in series to an inverting input of the operational amplifier.

6. The receiver of claim 4, wherein the second resistor and the second capacitor connect in parallel between an inverting input and an output of the operational amplifier.

7. The receiver of claim 1, wherein the data signal fluctuates in response to the power transient and the threshold signal tracks the fluctuations in the data signal.

8. A method for compensating for power transients, comprising:
   receiving a data signal;
   detecting an occurrence of a power transient;
   generating a threshold signal based on the detected power transient wherein the generating a threshold signal includes:
      generating a threshold value,
      generating a compensation signal based on the detected power transient, and
      generating the threshold signal based on the threshold value and the compensation signal; and determining a state of the data signal based on the threshold signal.

9. The method of claim 8, wherein the generating the threshold signal based on the threshold value and the compensation signal includes:
   combining the threshold value and the compensation signal.

10. The method of claim 8, wherein the data signal fluctuates in response to the power transient and the threshold signal tracks the fluctuations in the data signal.

11. A terrestrial terminal connected to an optical underwater network, comprising:
   a transmitter configured to convert terrestrial signals into an optical format for transmission to the optical underwater network; and
   a receiver configured to receive an undersea optical signal from the optical underwater network, the receiver comprising:
      a filter configured to filter the optical signal,
      an optical-to-electrical converter configured to convert the optical signal to an electrical signal,
      signal conditioning logic configured to:
         process a data signal from the electrical signal,
         detect occurrence of a power transient, and
         generate a threshold signal based on the detected power transient, and
      demultiplexing logic configured to:
         receive the data signal and the threshold signal from the signal conditioning logic, and
         determine characteristics of the data signal based on the threshold signal.

12. The terminal of claim 11, wherein the signal conditioning logic includes:
   an operational amplifier,
   first and second resistors connected to an input of the operational amplifier, and
   first and second capacitors connected to an input of the operational amplifier, the first and second resistors, the first and second capacitors, and the operational amplifier being configured to generate the threshold signal based on the detected power transient.

13. The terminal of claim 12, wherein the first resistor and the first capacitor connect in series to an inverting input of the operational amplifier.

14. The terminal of claim 12, wherein the second resistor and the second capacitor connect in parallel between an inverting input and an output of the operational amplifier.

15. The receiver of claim 11, wherein the data signal fluctuates in response to the power transient and the threshold signal tracks the fluctuations in the data signal.

* * * * *